United States Patent [19]
Ino

[11] Patent Number: 5,946,154
[45] Date of Patent: Aug. 31, 1999

[54] DATA REPRODUCING DEVICE USING A HIGH-PASS FIR FILTER

[75] Inventor: Hiroyuki Ino, Chiba, Japan

[73] Assignee: Sony Corporation, Tokyo, Japan

[21] Appl. No.: 08/975,974

[22] Filed: Nov. 21, 1997

Related U.S. Application Data

[63] Continuation of application No. 08/533,087, Sep. 25, 1995, abandoned.

[30] Foreign Application Priority Data

Sep. 30, 1994 [JP] Japan .................................. 6-237041

[51] Int. Cl.$^6$ .................................................... G11B 5/035
[52] U.S. Cl. .............................................. 360/65; 360/67
[58] Field of Search .................................. 360/31, 65, 67, 360/46, 48, 51; 364/724.2, 825, 724.16, 602; 348/616; 381/4, 103; 330/149; 371/43; 333/167; 324/128; 327/555; 455/213

[56] References Cited

U.S. PATENT DOCUMENTS

| | | | |
|---|---|---|---|
| 4,888,808 | 12/1989 | Ishikawa et al. ...................... | 381/103 |
| 5,097,235 | 3/1992 | Reichel .................................. | 333/167 |
| 5,257,312 | 10/1993 | Therssen et al. ..................... | 381/4 |
| 5,511,080 | 4/1996 | Itoi et al. ............................... | 371/43 |
| 5,627,694 | 5/1997 | Ido et al. ................................ | 360/51 |

FOREIGN PATENT DOCUMENTS 2035738  6/1980  United Kingdom.

*Primary Examiner*—Michael Tokar
*Assistant Examiner*—Patrick Wamsley
*Attorney, Agent, or Firm*—Jay H. Maioli

[57] ABSTRACT

In data reproducing device, a reproducing signal is detected from a magnetic recording medium in which data is recorded, and an equalizer equalizes the reproducing signal. A sampling circuit samples the reproducing signal from the equalizer, and a filter having a characteristic of linearly delaying a phase of the reproducing signal in a frequency range not higher than a predetermined frequency performs filtering of the resulting sampled value. Thus, phase compensation in a low frequency range of the reproducing signal can be performed satisfactorily in comparison with the conventional device.

6 Claims, 11 Drawing Sheets

DATA REPRODUCING DEVICE USING A HIGH-PASS FIR FILTER

This is a continuation of application Ser. No. 08/533,087 filed Sep. 25, 1995 abandoned.

BACKGROUND OF THE INVENTION

1. Field of the Invention

This invention relates to a data reproducing device, and particularly to a data reproducing device for detecting a reproducing signal from a magnetic recording medium like a magnetic disk by a magnetic head to reproduce data.

2. Description of the Related Art

In a digital audio tape recorder (DAT) or a magnetic disk device for recording data on a magnetic recording medium like a magnetic tape or a magnetic disk and reproducing the data therefrom, a magnetic head (so-called ring head) is used as a recording head or a reproducing head. In such a magnetic disk device, for example, a reproducing signal is detected by the magnetic head from the magnetic disk on which data is recorded, and the reproducing signal has its waveform equalized by an equalizer so that the data is reproduced.

This equalizer is normally constituted by an integrating circuit having an integration characteristic with respect to low frequency bands, a differentiating circuit having a differentiation characteristic with respect to high frequency bands, a phase equalizer for changing the phase without changing the amplitude, and a low pass filter (LPF) for passing signals of required frequency bands. The integrating circuit compensates the differentiation characteristic of the magnetic head, and the differentiating circuit compensates the loss due to a gap in the magnetic head. The phase equalizer corrects a phase shift due to the LPF and the phase of the bands.

In the DAT and the magnetic disk device, the waveform of the reproducing signal is equalized by the equalizer of the foregoing circuit structure to reproduce the data. However, the following problem is raised.

When a satisfactory integration characteristic in a low frequency range is obtained with the equalizer constituted by an analog circuit, the resistor or the capacitor constituting the integrating circuit exhibits an impractical resistance or capacitance value. That is, with the equalizer of the analog circuit, a satisfactory integration characteristic cannot be obtained. On the other hand, when the integration circuit is constituted by a digital filter, the order increases excessively, causing a large phase shift. Therefore, the phase equalizer in a subsequent stage becomes complex, and the differentiating circuit cannot perfectly correct the loss due to the gap of the reproducing head.

The circuits constituting the reproducing system, such as the reproducing amplifier and the equalizer, are connected to each other via so-called coupling capacitors for cutting the direct current (DC). These coupling capacitors function as high pass filters (HPFs) for removing low frequency components of the reproducing signal. The phase shift caused by these HPFs adversely affects waveform equalization.

With a device like the DAT employing a rotary head formed of a magnetic head and a rotary transducer, the rotary transducer for receiving the reproducing signal from the magnetic head causes a phase shift of the low frequency bands of the reproducing signal, thus adversely affecting waveform equalization.

That is, a primary LPF having a transfer function H as expressed by the following equation (1) exhibits a phase characteristic θ as expressed by the following equation (2).

$$H=\omega_0/(s+\omega_0) \quad (1)$$

$$\theta=-\tan^{-1}(\omega/\omega_0) \quad (2)$$

As shown in FIG. 1, if $\omega=0$, $\theta=0$. If $\omega=\omega_0$ ($=2\pi f_0$, with $f_0$ expressing the cut-off frequency), $\theta=-\pi/4$. If $\omega=\infty$, $\theta=-\pi/2$.

On the other hand, a primary HPF having a transfer function H as expressed by the following equation (3) exhibits a phase characteristic θ as expressed by the following equation (4).

$$H=s/(s+\omega_0) \quad (3)$$

$$\theta=\tan^{-1}(\omega_0/\omega) \quad (4)$$

As shown in FIG. 1, if $\omega=0$, $\theta=\pi/2$. If $\omega=\omega_0$, $\theta=\pi/4$. If $\omega=\infty$, $\theta=0$. Either with LPF or with HPF, the phase shifts ahead of the cut-off frequency in the low frequency range, with $f_0$ as the reference.

When a linear circuit is employed, the phase characteristic is such that the phase shifts ahead in the low frequency range do not change with any order, and failure in integration equalization is generated. Also, when the phase of the low frequency range of the reproducing signal is shifted ahead by the coupling HPF or the rotary transducer, the analog circuit can only shift the phase of the low frequency range further ahead by using a high-order phase shifter or a combination of plural primary phase shifters having a transfer function H and a phase characteristic θ as expressed by the following equations (5) and (6), wherein if $\omega=0$, $\theta=0$; if $\omega=\omega_0$, $\theta=-\pi/2$; and if $\omega=\infty$, $\theta=-\pi$.

$$H=(s-\omega_0)/(s+\omega_0) \quad (5)$$

$$\theta=\tan^{-1}((2\omega-\omega_0)/(\omega^2-\omega_0^2)) \quad (6)$$

Thus, phase compensation is difficult.

Specifically, with a DAT, when the bit rate (frequency) of data recorded on magnetic tape is set to $f_r$ Hz, the cut-off frequency $f_0$ of the conventional integrating circuit is $f_r/128$ to $f_r/64$. About four of the coupling HPFs are used in the reproducing amplifier and the equalizer, and the cut-off frequency $f_0$ thereof is $f_r/512$. The cut-off frequency $f_0$ of the rotary transducer is $f_r/1024$ to $f_r/512$.

Accordingly, with a conventional device like the DAT, the phase of the low frequency range of the reproducing signal largely shifts ahead, as shown FIG. 2. The conventional equalizer compensates the phase shift only with respect to frequencies not lower than a predetermined frequency, and does not perform phase compensation with respect to frequencies lower than the predetermined frequency. Stated differently, with the conventional DAT or magnetic disk device, phase compensation of the low frequency range is not performed satisfactorily. Therefore, an error correction code with high error correction ability, that is, high redundancy is required, even though an increase in the density of a magnetic recording medium like the magnetic disk is difficult.

OBJECT AND SUMMARY OF THE INVENTION

In view of the foregoing, it is an object of the present invention to provide a data reproducing device in which phase compensation of the low frequency range of the reproducing signal detected from the magnetic recording medium by the magnetic head may be performed satisfactorily in comparison with the conventional device.

According to the present invention, there is provided a data reproducing device for reproducing data recorded on a magnetic recording medium. The device includes a magnetic head for detecting a reproducing signal from the magnetic recording medium, an equalizer for equalizing a waveform of the reproducing signal from the magnetic head, a sampling circuit for sampling the reproducing signal from the equalizer to output a sampled value, and a filter for filtering the sampled value from the sampling circuit and compensating a phase of the reproducing signal. The filter has a phase characteristic such that the phase of the reproducing signal is linearly delayed in a frequency range not higher than a predetermined frequency.

Specifically, the phase characteristic of the filter is proportional (linear) in a range having frequencies of 0 Hz to $(i/N)f_r$ Hz, with $f_r$ denoting a sampling frequency, N an order of the filter, and i an arbitrary positive integer. The phase characteristic of the filter is 0 degree in a range having frequencies not lower than $(i/N)f_r$ Hz.

The filter has an amplitude characteristic which is 0 in a range having frequencies of 0 Hz to $(j/N)f_r$ Hz, proportional in a range having frequencies of $(j/N)f_r$ Hz to $(k/N)f_r$ Hz, and 1 in a range having frequencies not lower than $(k/N)f_r$ Hz. In this case, i, j and k are arbitrary positive integers holding a relation of i<j<k.

The data reproducing device according to the present invention also has a Viterbi decoder for carrying out Viterbi decoding of the sampled value with its phase corrected by the filter.

In addition, in the data reproducing device of the present invention, the data recorded on the magnetic recording medium is data pre-coded in response to a partial response (1, 1). The data recorded on the magnetic recording medium is data transformed to a code free of DC.

An FIR filter may be used as the above-mentioned filter. In this case, the FIR filter has a phase characteristic approximate to a phase characteristic which is proportional in a range having frequencies of 0 Hz to $(i/N)f_r$ Hz and is 0 in a range having frequencies not lower than $(i/N)f_r$ Hz, with $f_r$ denoting a sampling frequency, N an order of the filter, and i an arbitrary positive integer. The FIR filter has an amplitude characteristic which is 0 in a range having frequencies of 0 Hz to $(j/N)f_r$ Hz, proportional in a range having frequencies of $(j/N)f_r$ Hz to $(k/N)f_r$ Hz, and 1 in a range having frequencies not lower than $(k/N)f_r$ Hz.

A coefficient of the FIR filter is obtained by performing inverse Fourier transform on the phase characteristic and the amplitude characteristic which are to be approximated. The FIR filter may be constituted by using only coefficients corresponding to samples at the periphery of a sample having a maximum value up to a sample having a zero-crossing coefficient value from the N samples of the FIR filter.

In the present invention, the magnetic head detects the reproducing signal from the magnetic recording medium on which data is recorded, and the equalizer equalizes the waveform of the reproducing signal. The sampling circuit samples the reproducing signal from the equalizer, and the filter, having the characteristic of linearly delaying the phase of the reproducing signal in a range having frequencies not higher than the predetermined frequency, filters the resulting sampled value, thus correcting the phase of the reproducing signal.

DESCRIPTION OF THE PREFERRED EMBODIMENT

A preferred embodiment of the data recording/reproducing device according to the present invention will now be described with reference to the attached drawings.

In this embodiment, the present invention applies to a data recording/reproducing device employing a magnetic tape as a magnetic recording medium for recording data on the magnetic tape with a rotary head formed of a magnetic head and reproducing the data from the magnetic tape with the rotary head.

Figure 3:
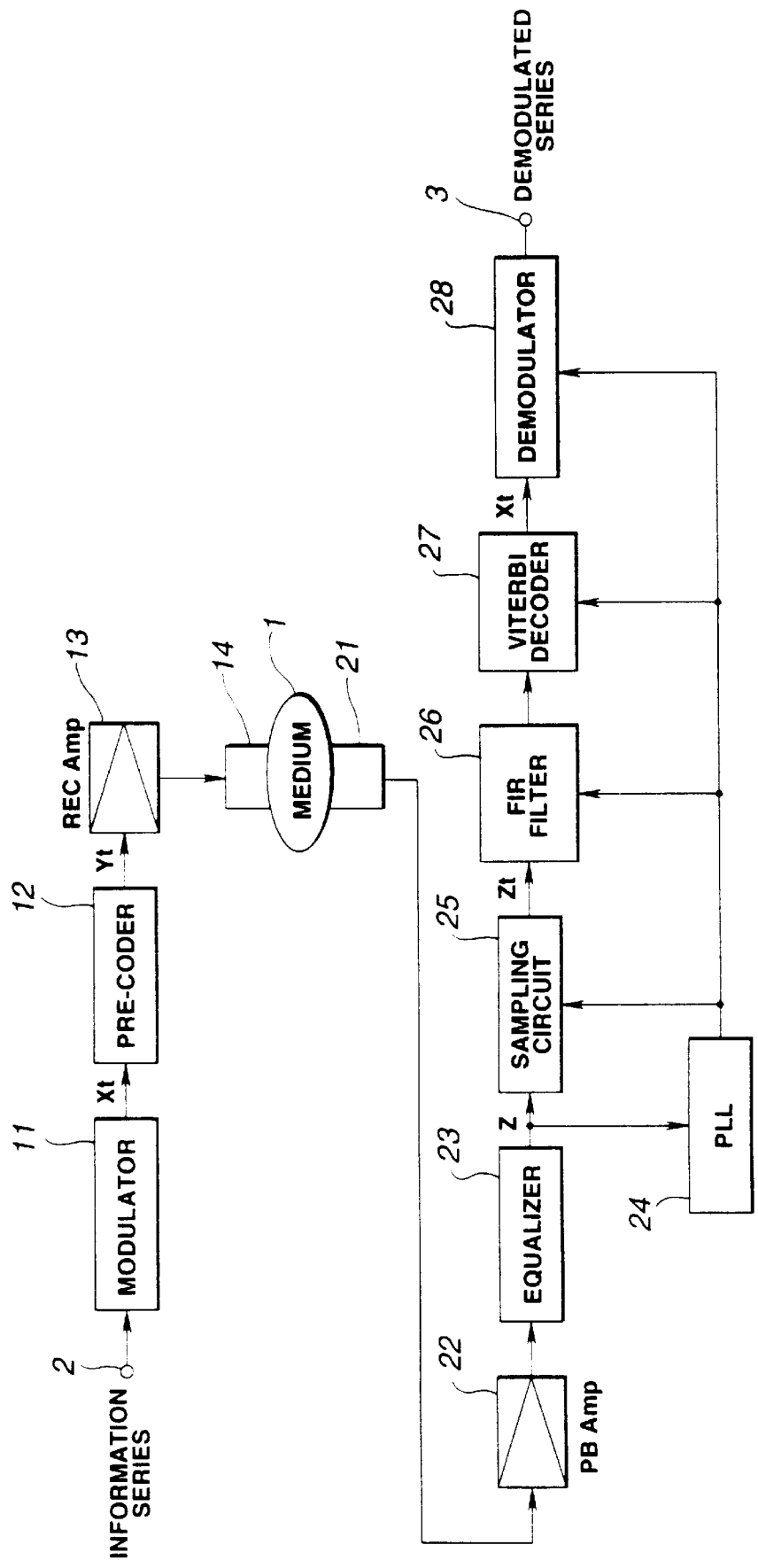
FIG. 3 is a graph showing frequency characteristics of the FIR filter.

In the data recording/reproducing device to which the present invention applies, a recording system is constituted by a modulator 11 for modulating data in a manner suitable for recording on a magnetic tape 1, a pre-coder 12 for pre-coding a modulated series $x_t$ from the modulator 11, a recording amplifier 13 for amplifying an intermediate series $y_t$ from the pre-coder 12, and a recording head 14 for recording the intermediate series $y_t$ amplified by the recording amplifier 13 on the magnetic tape 1, as shown in FIG. 3. The recording head 14 is formed of a rotary head having a magnetic head and a rotary transducer.

The modulator 11 is constituted by a modulator suitable for recording on the magnetic tape 1, that is, a modulator having direct current (DC) components removed therefrom by the rotary transducer of the recording head 14, thus transforming data to a code by code rules free of DC, such as so-called 8–10 conversion. This modulator 11 transforms data entered as an information series (hereinafter referred to simply as information series) to the modulated series $x_t$ (t=0, 1, 2 . . .) via a terminal 2.

The pre-coder 12 is a pre-coder in a partial response (1, 1) (hereinafter referred to as PR (1, 1)), that is, a pre-coder constituted by an exclusive OR (EXOR) circuit and a delay unit for delaying the intermediate series $y_t$ outputted from the EXOR circuit and supplying the delayed series to the EXOR circuit. In the pre-coder 12, the EXOR circuit finds an exclusive OR of the modulated series $x_t$ supplied from the modulator 11 and the intermediate series $y_t$ delayed by the delay unit. That is, the pre-coder 12 adds the so-called modulo 2 to the modulated series $x_t$ to generate the intermediate series $y_t$, and supplies the intermediate series $y_t$ to the recording amplifier 13.

The recording amplifier 13 amplifies the intermediate series $y_t$ to drive the recording head 14. The recording head 14 is formed of the rotary head, as described above, to record on the magnetic tape 1 a recording signal based on the intermediate series $y_t$ supplied from the recording amplifier 13 via the rotary transducer.

Thus, the data (information series) entered via the terminal 2 is recorded on the magnetic tape 1.

On the other hand, in the data recording/reproducing device, a reproducing system is constituted by a reproducing head 21 for detecting a reproducing signal from the magnetic tape 1, a reproducing amplifier 22 for amplifying the reproducing signal from the reproducing head 21, an equalizer 23 for equalizing the waveform of the reproducing signal from the reproducing amplifier 22, a phase locked loop (PLL) 24 for extracting clock components from the reproducing signal from the equalizer 23, a sampling circuit 25 for sampling the reproducing signal from the equalizer 23 using the clock from the PLL 24 and outputting a discrete sampled value, a finite impulse response (FIR) filter 26 for filtering the sampled value from the sampling circuit 25 and correcting the phase of the reproducing signal, a Viterbi decoder 27 for carrying out Viterbi decoding of the sampled value from the sampling circuit 25, and a demodulator 28 for demodulating an output of the Viterbi decoder 27, as shown in FIG. 3.

The reproducing head 21, formed of a rotary head, detects the reproducing signal from the magnetic tape 1 and supplies the reproducing signal to the reproducing amplifier 22 via a rotary transducer and a coupling capacitor for removing direct current (DC) components. The reproducing amplifier 22 amplifies the reproducing signal and supplies the amplified reproducing signal to the equalizer 23 via the coupling capacitor.

The equalizer 23 is formed of a normal equalizer of a conventional analog circuit. That is, the equalizer 23 has an integrating circuit having integration characteristics with respect to low frequency bands to compensate differentiation characteristics of the reproducing head (magnetic head) 21, a differentiating circuit having differentiation characteristics with respect to high frequency bands to compensate the loss due to the gap of the reproducing head 21, a low pass filter (LPF) for passing only signals of required frequency bands, and a phase equalizer for changing the phase without changing the amplitude to compensate for the phase shift caused by the LPF.

Figure 1:
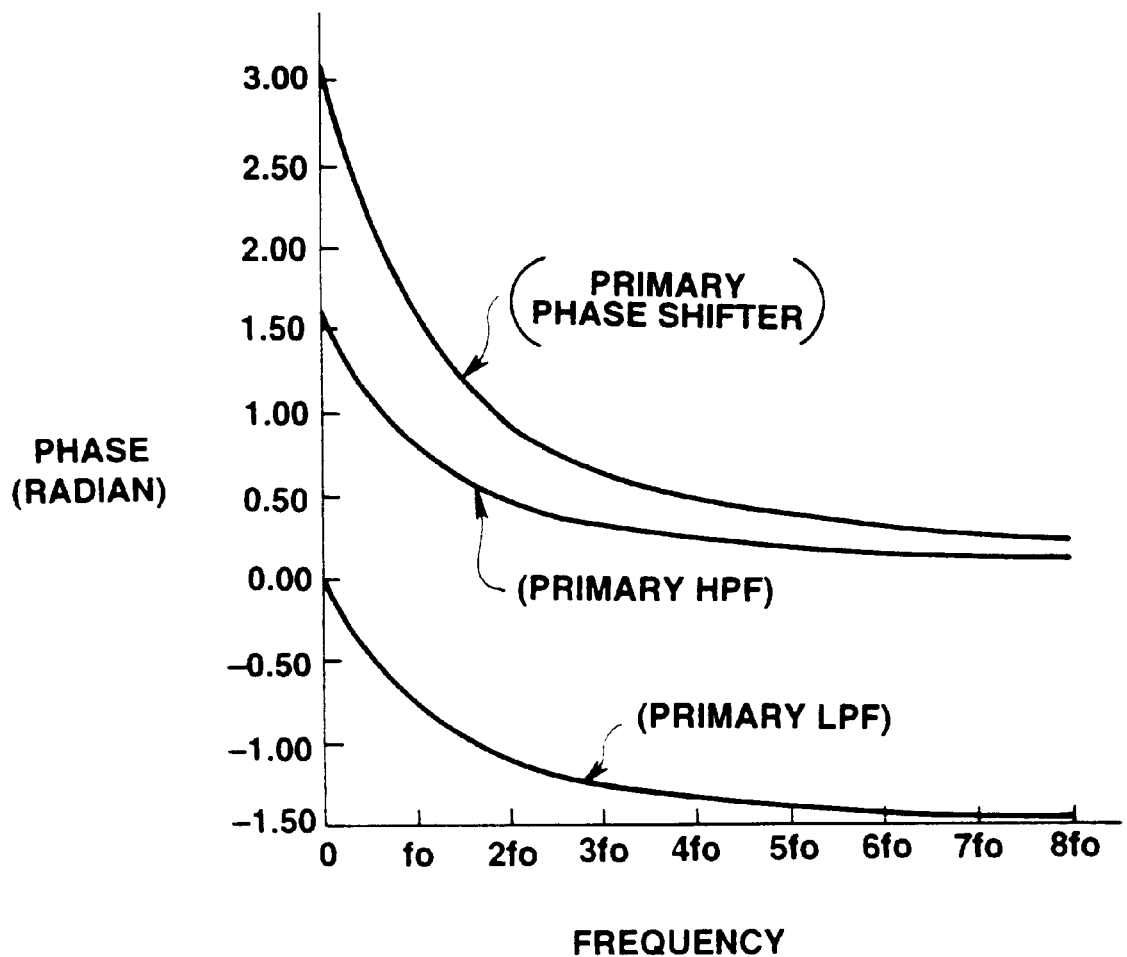
FIG. 1 is a block diagram showing a specific structure of a data recording/reproducing device to which the present invention applies.
Figure 2:
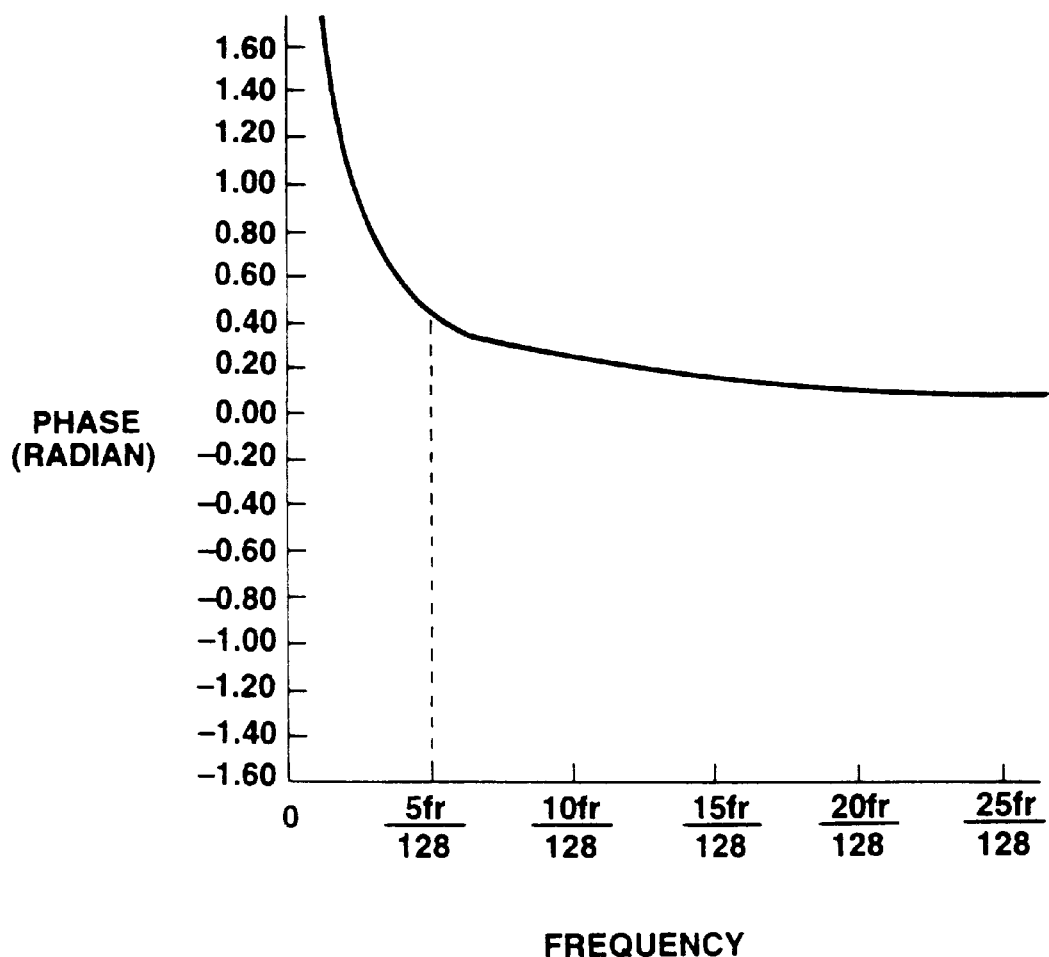
FIG. 2 is a block diagram showing a specific circuit structure of an FIR filter constituting the data recording/reproducing device.

The equalizer 23 equalizes the waveform of the reproducing signal supplied from the reproducing amplifier 22, and supplies the waveform-equalized reproducing signal as a transmission path output Z to the PLL 24 and to the sampling circuit 25. Accordingly, the transmission path output Z as the output of the equalizer 23 is a signal in which the phase largely shifts ahead in the low frequency range, as shown in FIG. 2 referred to in the description of the conventional technique.

The PLL 24 extracts clock components from the output Z of the transmission path composed of the magnetic tape 1 and the like, that is, generates a clock synchronous with the reproducing signal, and supplies the clock to the sampling circuit 25, the FIR filter 26, the Viterbi decoder 27 and the demodulator 28.

The sampling circuit 25 samples the transmission path output Z by the clock supplied from the PLL 24, and supplies the resulting sampled value (data) as the sampled series $z_t$ to the FIR filter 26.

Figure 4:
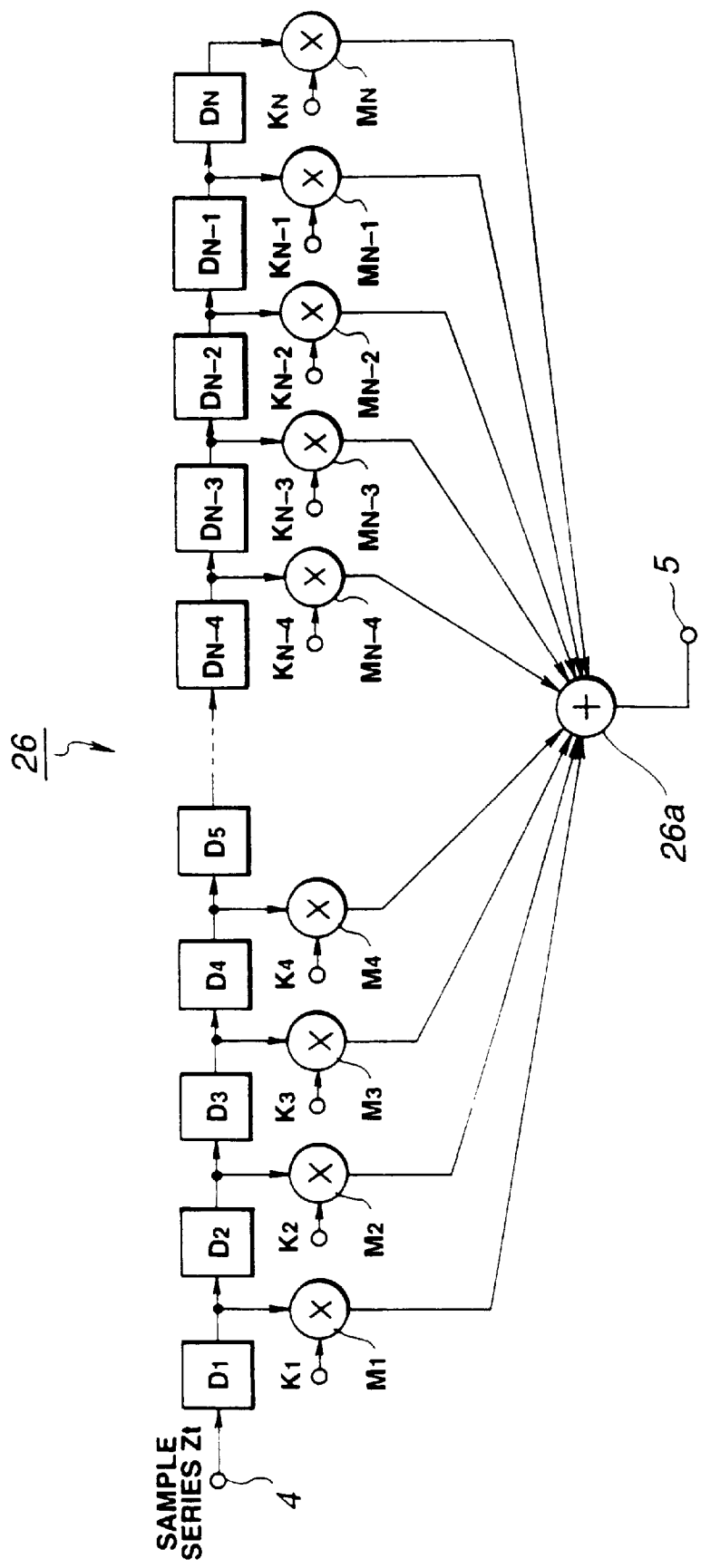
FIG. 4 is a graph showing values of coefficients of the FIR filter.

The FIR filter 26 is formed by an N-order FIR filter. That is, the FIR filter 26 has N cascaded delay units $D_1, D_2 \ldots D_N$ for respectively delaying the sampled series $z_t$ supplied from the sampling circuit 25 by one sample time. The FIR filter 26 also has N multipliers $M_1, M_2 \ldots M_N$ for multiplying outputs of the delay units $D_i$ on the respective stages by coefficients $K_i$. The FIR filter 26 also has an adder 26a for adding the outputs of the multipliers $M_1$ to $M_N$ as shown in FIG. 4. The delay unit $D_1$ delays the sampled series $z_t$ supplied from the sampling circuit 25 via a terminal 4 by one sample time, and the delay unit $D_2$ delays the output of the delay unit $D_1$ by one sample time. Similarly, the delay unit $D_i$ delays the output of the delay unit $D_{i-1}$ by one sample time.

The multiplier $M_i$ on each stage multiplies the output of the delay unit $D_i$ on the same stage by the coefficient $K_i$. The adder 26a adds the outputs of all the multipliers $M_1$ to $M_N$. The output of the adder 26a is supplied to the Viterbi decoder 27 as shown in FIG. 3 via a terminal 5.

Figure 5:
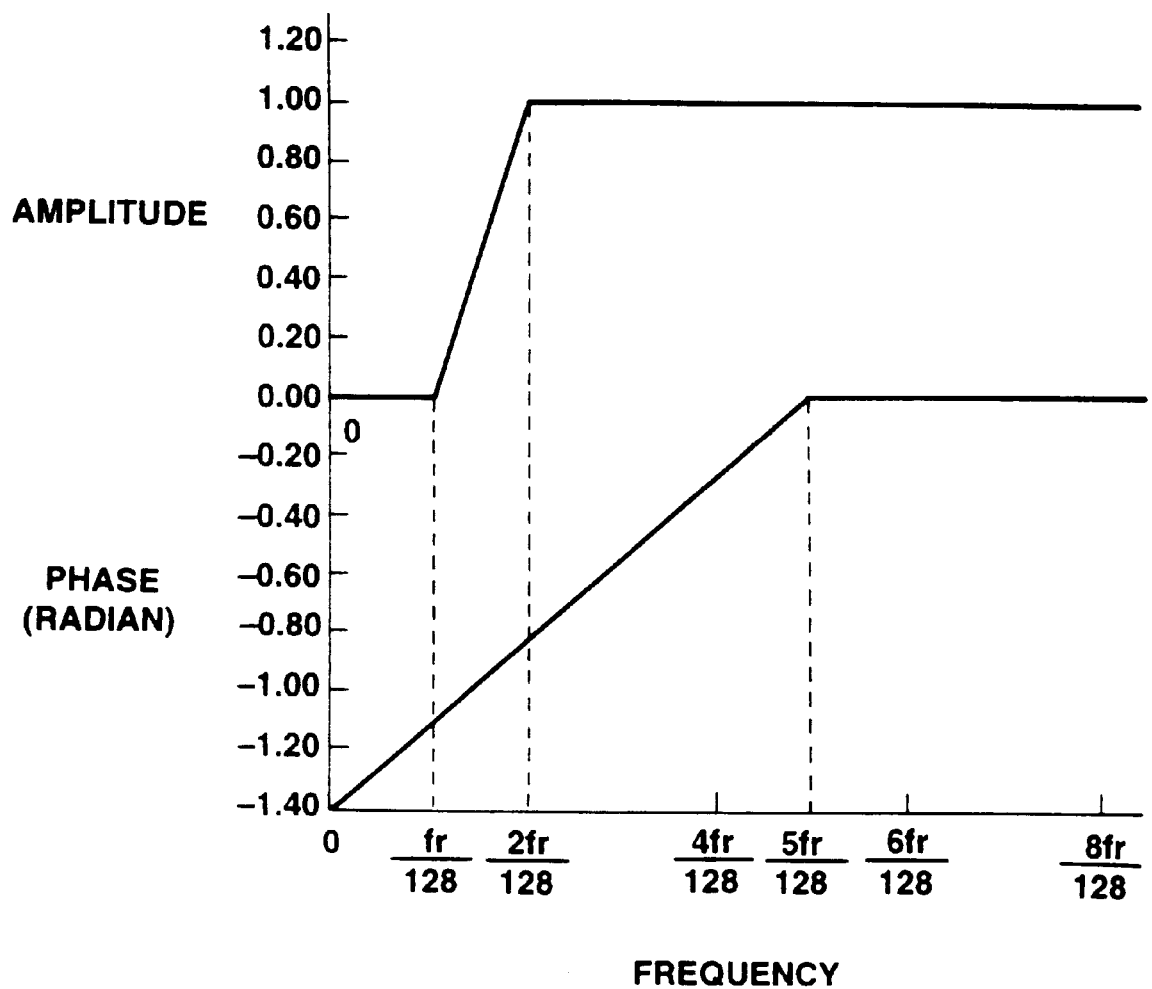
FIG. 5 is a graph showing phase characteristics of a reproducing system of the data recording/reproducing device.

Specifically, the FIR filter 26 has the frequency characteristic, as shown in FIG. 5, such that the phase of the reproducing signal is linearly delayed in a range having frequencies not higher than the predetermined frequency. That is, the sampling frequency corresponding to the recording rate (bit rate) of the magnetic tape 1 is set to $f_r$ Hz. The amplitude characteristic is 0 in a range having frequencies lower than $f_r/128$ Hz, varies linearly between a point of 0 ($f_r/128$ Hz) and a point of 1 ($2f_r/128$ Hz) in a range having frequencies of $f_r/128$ Hz to $2f_r/128$ Hz, and is 1 in a range having frequencies not lower than $2f_r/128$ Hz. The phase characteristic varies linearly between a point of −80 degrees (0 Hz) and a point of 0 degree ($5f_r/128$ Hz) in a range having frequencies not higher than $5f_r/128$ Hz, and is 0 degree in a range having frequencies not lower than $5f_r/128$ Hz. In this case, 128 denotes the number of stages of the FIR filter. The $f_r$/number of filters expresses the resolution of the filter characteristic.

With respect to the amplitude characteristic, when the low frequency spectrum of the code obtained through modulation by the modulator 11 is restrained sufficiently, that is, when the degree of restriction of the spectrum from DC (frequency 0) is high, the cut-off frequency of the FIR filter 26 may be raised.

With respect to the phase characteristic, when the cut-off frequency of the phase characteristic of the rotary transducer and the integrating circuit in the equalizer 23 is high, the cut-off frequency of the phase characteristic of the FIR filter 26 may be raised proportionally.

Figure 6:
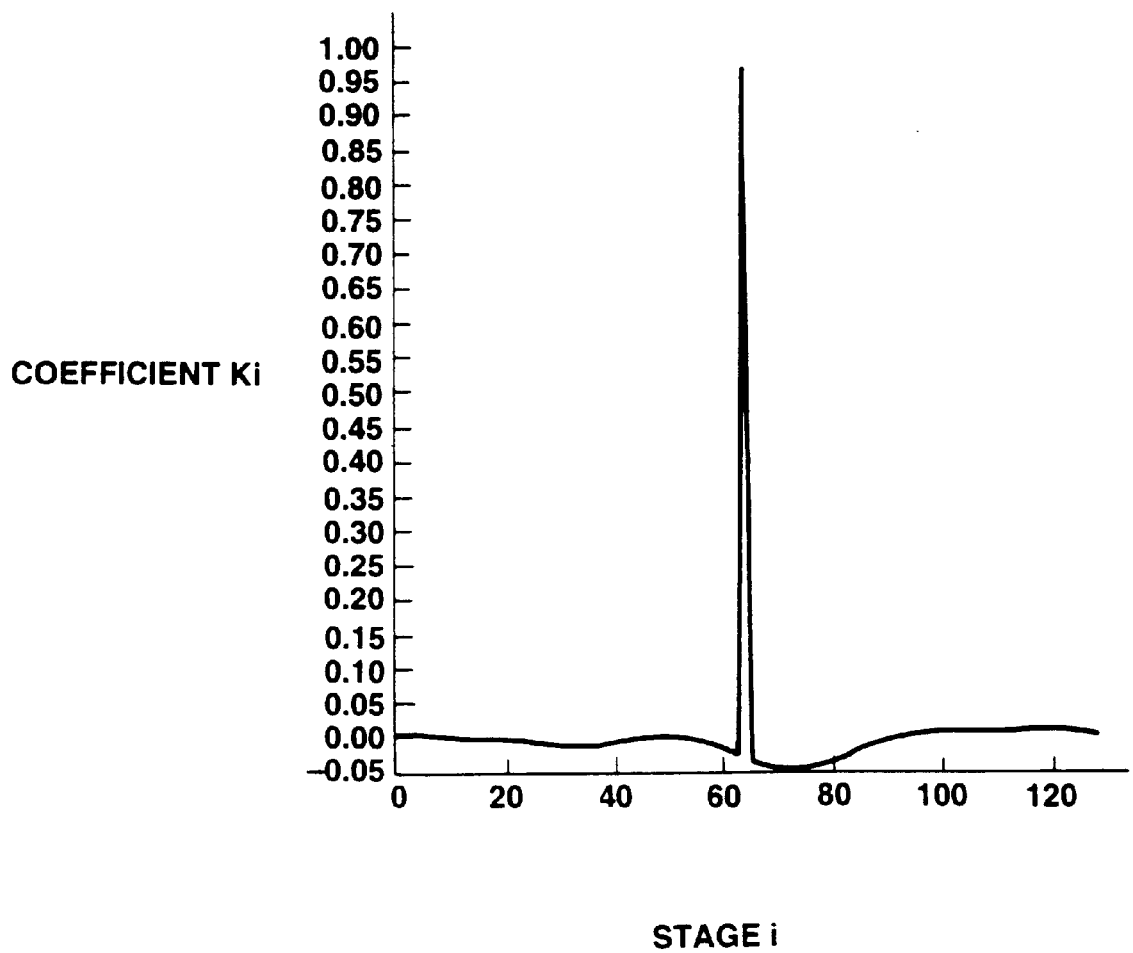
FIG. 6 is a block diagram showing a specific circuit structure of a Viterbi decoder constituting the data recording/reproducing device.

To generate the above-described frequency characteristic, the order N of the FIR filter 26 is set to 128, and its coefficient $K_i$ is set to values such as shown in FIG. 6 and the following Table 1. These coefficients $K_i$ are found by performing inverse discrete Fourier transform (IDFT) on the phase characteristic and the amplitude characteristic.

TABLE 1

| STAGE (i) | CO-EFFICIENT ($K_i$) | STAGE (i) | CO-EFFICIENT ($K_i$) | STAGE (i) | CO-EFFICIENT ($K_i$) |
|---|---|---|---|---|---|
| 1 | 0.004412 | 46 | −0.001373 | 91 | −0.003665 |
| 2 | 0.003640 | 47 | −0.000420 | 92 | −0.001549 |
| 3 | 0.002870 | 48 | 0.000350 | 93 | 0.000293 |
| 4 | 0.002116 | 49 | 0.000890 | 94 | 0.001861 |
| 5 | 0.001393 | 50 | 0.001158 | 95 | 0.003163 |
| 6 | 0.000714 | 51 | 0.001118 | 96 | 0.004213 |
| 7 | 0.000086 | 52 | 0.000740 | 97 | 0.005032 |
| 8 | −0.000483 | 53 | 0.000003 | 98 | 0.005645 |

TABLE 1-continued

| STAGE (i) | CO-EFFICIENT ($K_i$) | STAGE (i) | CO-EFFICIENT ($K_i$) | STAGE (i) | CO-EFFICIENT ($K_i$) |
|---|---|---|---|---|---|
| 9 | −0.000992 | 54 | −0.001107 | 99 | 0.006082 |
| 10 | −0.001441 | 55 | −0.002592 | 100 | 0.006372 |
| 11 | −0.001834 | 56 | −0.004444 | 101 | 0.006548 |
| 12 | −0.002179 | 57 | −0.006645 | 102 | 0.006640 |
| 13 | −0.002487 | 58 | −0.009167 | 103 | 0.006680 |
| 14 | −0.002768 | 59 | −0.011971 | 104 | 0.006692 |
| 15 | −0.003037 | 60 | −0.015009 | 105 | 0.006701 |
| 16 | −0.003308 | 61 | −0.018227 | 106 | 0.006726 |
| 17 | −0.003594 | 62 | −0.021562 | 107 | 0.006781 |
| 18 | −0.003909 | 63 | −0.024947 | 108 | 0.006876 |
| 19 | −0.004263 | 64 | −0.028313 | 109 | 0.007013 |
| 20 | −0.004666 | 65 | 0.968413 | 110 | 0.007193 |
| 21 | −0.005121 | 66 | −0.034699 | 111 | 0.007411 |
| 22 | −0.005631 | 67 | −0.037581 | 112 | 0.007657 |
| 23 | −0.006193 | 68 | −0.040169 | 113 | 0.007919 |
| 24 | −0.006801 | 69 | −0.042405 | 114 | 0.008183 |
| 25 | −0.007443 | 70 | −0.044239 | 115 | 0.008432 |
| 26 | −0.008106 | 71 | −0.045632 | 116 | 0.008649 |
| 27 | −0.008770 | 72 | −0.046552 | 117 | 0.008818 |
| 28 | −0.009415 | 73 | −0.046980 | 118 | 0.008924 |
| 29 | −0.010018 | 74 | −0.046908 | 119 | 0.008953 |
| 30 | −0.010554 | 75 | −0.046340 | 120 | 0.008896 |
| 31 | −0.011000 | 76 | −0.045290 | 121 | 0.008744 |
| 32 | −0.011331 | 77 | −0.043785 | 122 | 0.008494 |
| 33 | −0.011528 | 78 | −0.041861 | 123 | 0.008145 |
| 33 | −0.011572 | 79 | −0.039560 | 124 | 0.007702 |
| 35 | −0.011450 | 80 | −0.036935 | 125 | 0.007171 |
| 36 | −0.011153 | 81 | −0.034043 | 126 | 0.006562 |
| 37 | −0.010680 | 82 | −0.030946 | 127 | 0.005889 |
| 38 | −0.010034 | 83 | −0.027707 | 128 | 0.005167 |
| 39 | −0.009227 | 84 | −0.024389 | | |
| 40 | −0.008276 | 85 | −0.021056 | | |
| 41 | −0.007208 | 86 | −0.017766 | | |
| 42 | −0.006052 | 87 | −0.014576 | | |
| 43 | −0.004847 | 88 | −0.011532 | | |
| 44 | −0.003635 | 89 | −0.008678 | | |
| 45 | −0.002461 | 90 | −0.006047 | | |

That is, with the frequency characteristic of the N-order filter set to $H(e^{j2\pi f/fr})$, the transmission path output Z is sampled on the frequency axis every $f_r/N$ Hz. Consequently, $H(0), H(1), \ldots, H(N-1)$ are generated.

When the amplitude and the phase of the k-th sampled value $H(k)$ on the frequency axis with k having values of 0, 1, 2, ..., N−1 are set to $A_k$ and $\theta_k$, respectively, the sampled value $H(k)$ is expressed by $H(k) = A_k e^{j\theta_k}$.

Since the coefficient of the N-order FIR filter is an impulse response of this FIR filter, through inverse discrete Fourier transform (IDFT), the $nT_r$-th time coefficient $K_i = h(nT_r)$ is expressed by $$h(nT_r) = \frac{1}{N} \sum_{k=0}^{N-1} H(k) \cdot e^{j2\pi kn/N} \quad (7)$$

$$= \frac{1}{N} \sum_{k=0}^{N-1} A_k e^{j\theta k} e^{j2\pi kn/N}$$

where $T_r = 1/f_r$ (one delay time) and n=0, 1, 2, ..., N−1.

Figure 7:
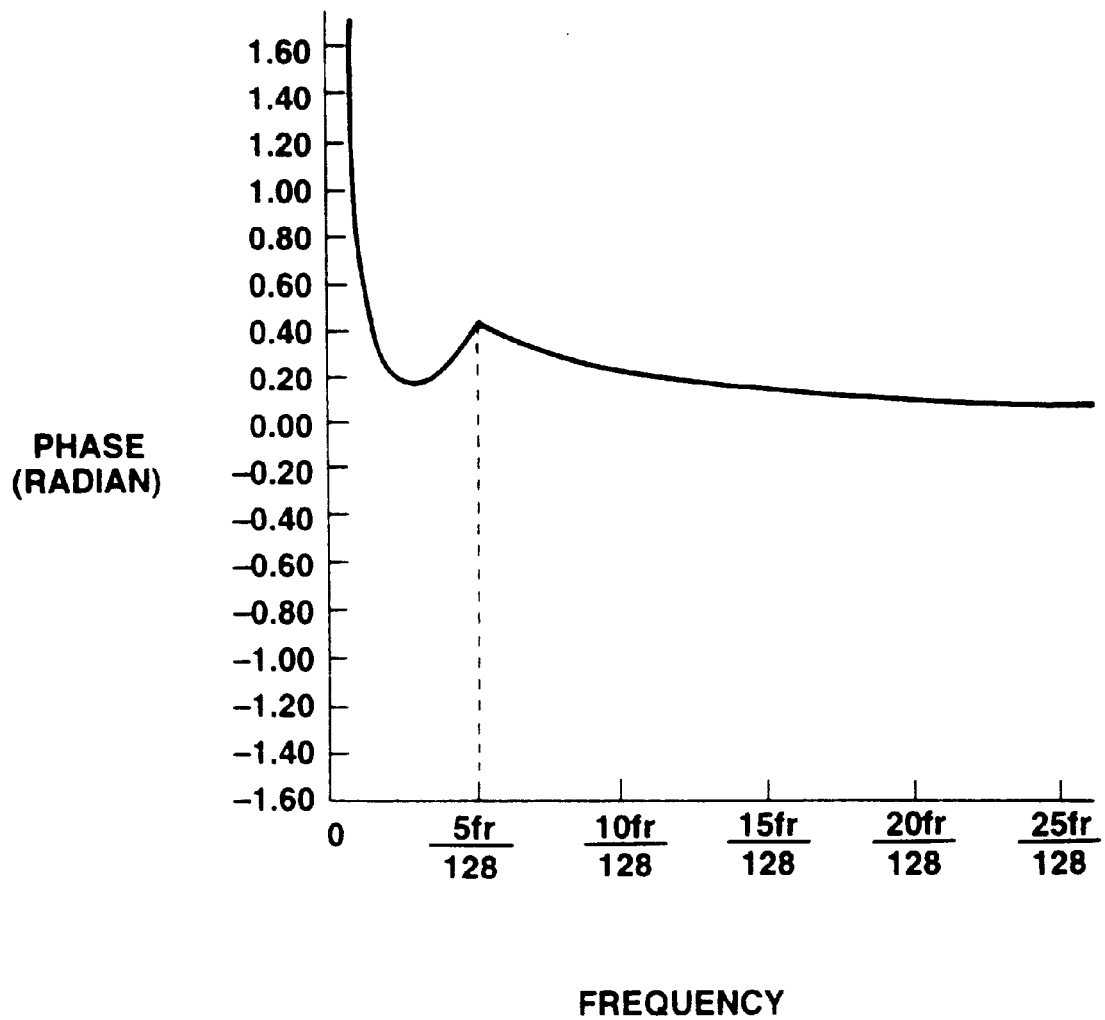
FIG. 7 is a graph showing error rates with respect to amplitude characteristics of the data recording/reproducing device.

Accordingly, the FIR filter 26 multiplies the 128 continuous sampling series $z_t$ by the coefficients $k_i$ respectively, and adds the resulting values to remove components not higher than $f_r/128$ Hz and linearly delay the phase of components not higher than $5f_r/128$ Hz. Thus, the phase shifted ahead in the low frequency range of the reproducing signal caused by the magnetic head, the rotary transducer and the coupling capacitor is corrected by the delay. Consequently, as shown in FIG. 7, the phase characteristic from the reproducing head 21 to the FIR filter 26 are produced by synthesizing the phase characteristic as shown in FIG. 2 and the phase characteristic as shown in FIG. 5. Stated differently, since this data recording/reproducing device employs the FIR filter 26, the phase of the low frequency range is closer to 0 than the phase characteristic as shown in FIG. 2. Therefore, the phase compensation of the low frequency range of the reproducing signal can be performed more satisfactorily than with the conventional device.

The Viterbi decoder 27 performs Viterbi decoding on the sampled series $z_t$ which is thus phase-compensated, that is, it detects a pulse with the maximum likelihood in a so-called Trellis diagram on the basis of the sampled series $z_t$. Thus, the Viterbi decoder 27 reproduces the modulated series $x_t$ corresponding to the output of the modulator 11 of the recording system and supplies the modulated series $x_t$ to the demodulator 28.

Figure 8:
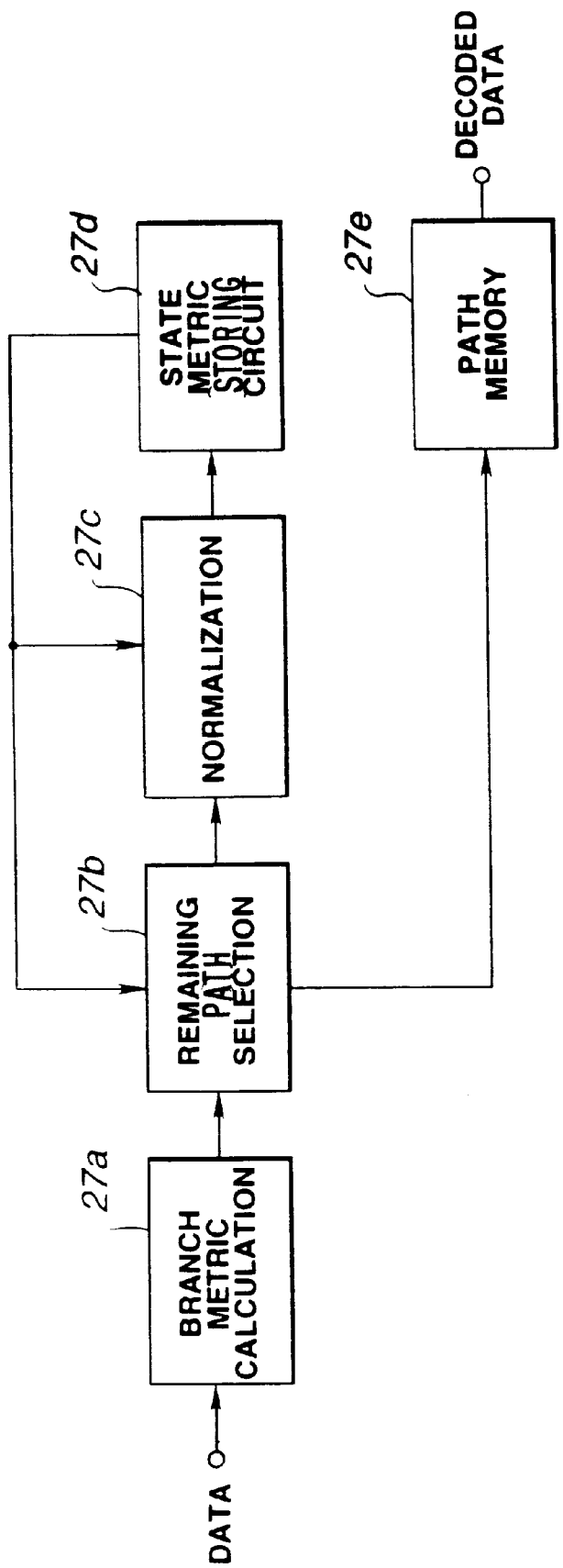
FIG. 8 is a graph showing error rates with respect to phase characteristics of the data recording/reproducing device.

Specifically, the Viterbi decoder 27 has a branch metric calculation circuit 27a for calculating a so-called branch metric, a remaining path selection circuit 27b for selecting the remaining path from the calculation result of the branch metric calculation circuit 27a, a normalization circuit 27c for normalizing a state metric for preventing an overflow, a state metric storing circuit 27d for storing the state metric, and a path memory 27e for outputting decoded data based on the remaining path, as shown in FIG. 8. The path memory 27e is constituted by n stages of a 1-bit shift register and a 1-bit multiplexor.

In this case, the branch metric expresses the degree of certainty of the branches in the course of moving from a state at one time point to a state at the next time point. The path expresses a series of transitions from one state to another. The state metric found by the remaining path selection circuit 27b expresses certainty of the past, that is, accumulation of the branch metric. The relative magnitude of this state metric is significant. However, in accordance with the foregoing definition of the state metric, continuous accumulation of the value of the state metric with the lapse of time generates an excessively large value of the state metric, which is no longer significant. Thus, in order to make the relative magnitude of the state metric significant while accumulating the value of the state metric, the normalization circuit 27c is provided.

The demodulator 28, corresponding to the modulator 11 of the recording system, decodes the modulated series $x_t$ to reproduce the original information series and outputs the information series as a demodulated series via a terminal 3. Thus, the data is reproduced from the magnetic tape 1.

The error rate of the above-described reproducing system varies with the frequency of the FIR filter 26. The results are as shown, for example, in FIGS. 9 and 10.

Figure 9:
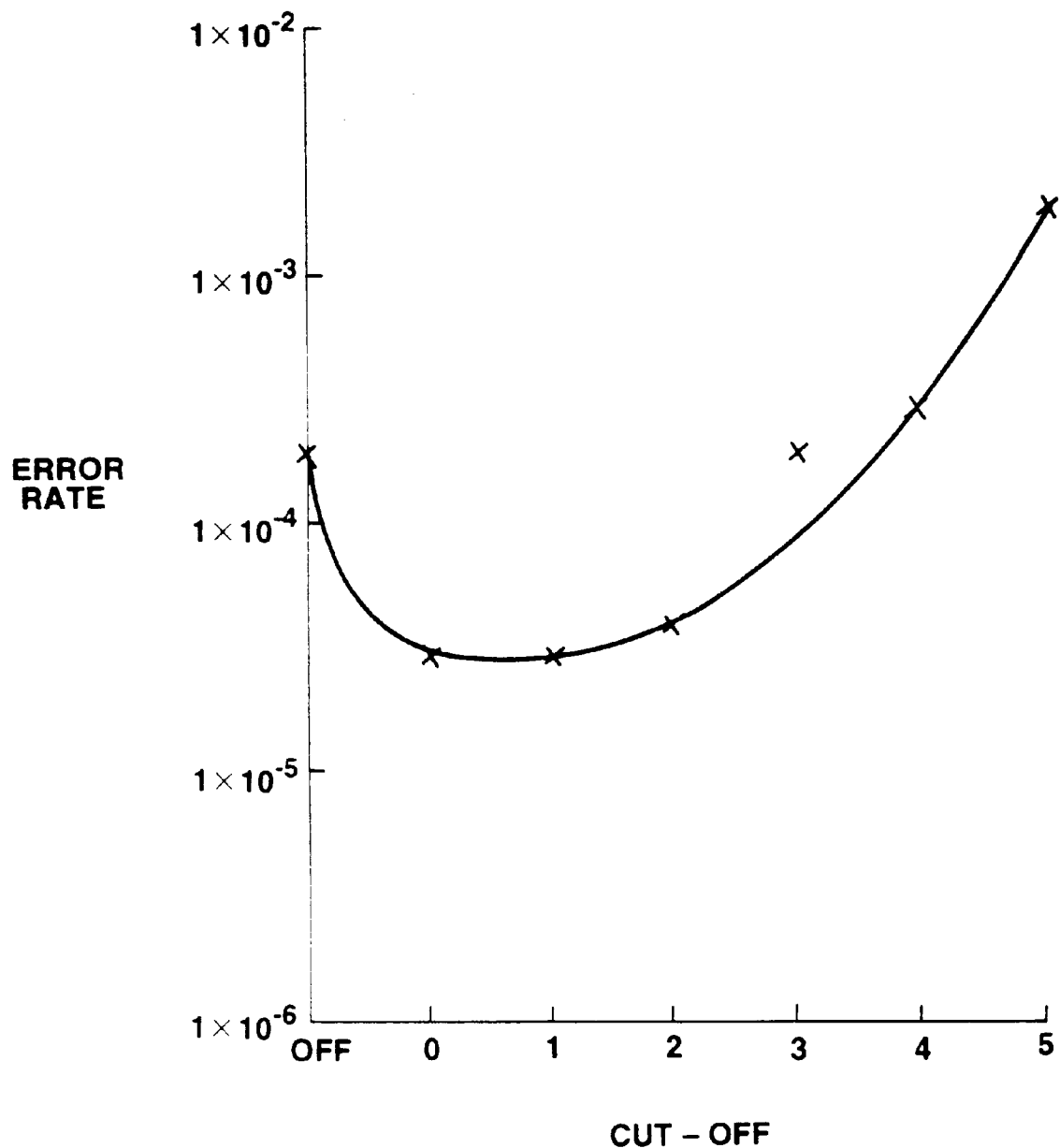
FIG. 9 is a graph showing values of coefficients of a 32-stage filter.

That is when, the phase characteristic is set to 0 degree (flat), and the frequency having the amplitude characteristic of 0 as shown in FIG. 5 is defined as the cut-off frequency of the amplitude. Then, the error rate is measured with the cut-off frequency varied to 0, $f_r/128$ Hz, $2f_r/128$ Hz, $3f_r/128$ Hz, $4f_r/128$ Hz and $5f_r/128$ Hz. In this data recording/reproducing device, the error rate may be improved in a range of cut-off frequencies of the amplitude from $f_r/128$ Hz to $2f_r/128$ Hz as compared with the case where the FIR is not provided (OFF), as shown in FIG. 9.

Figure 10:
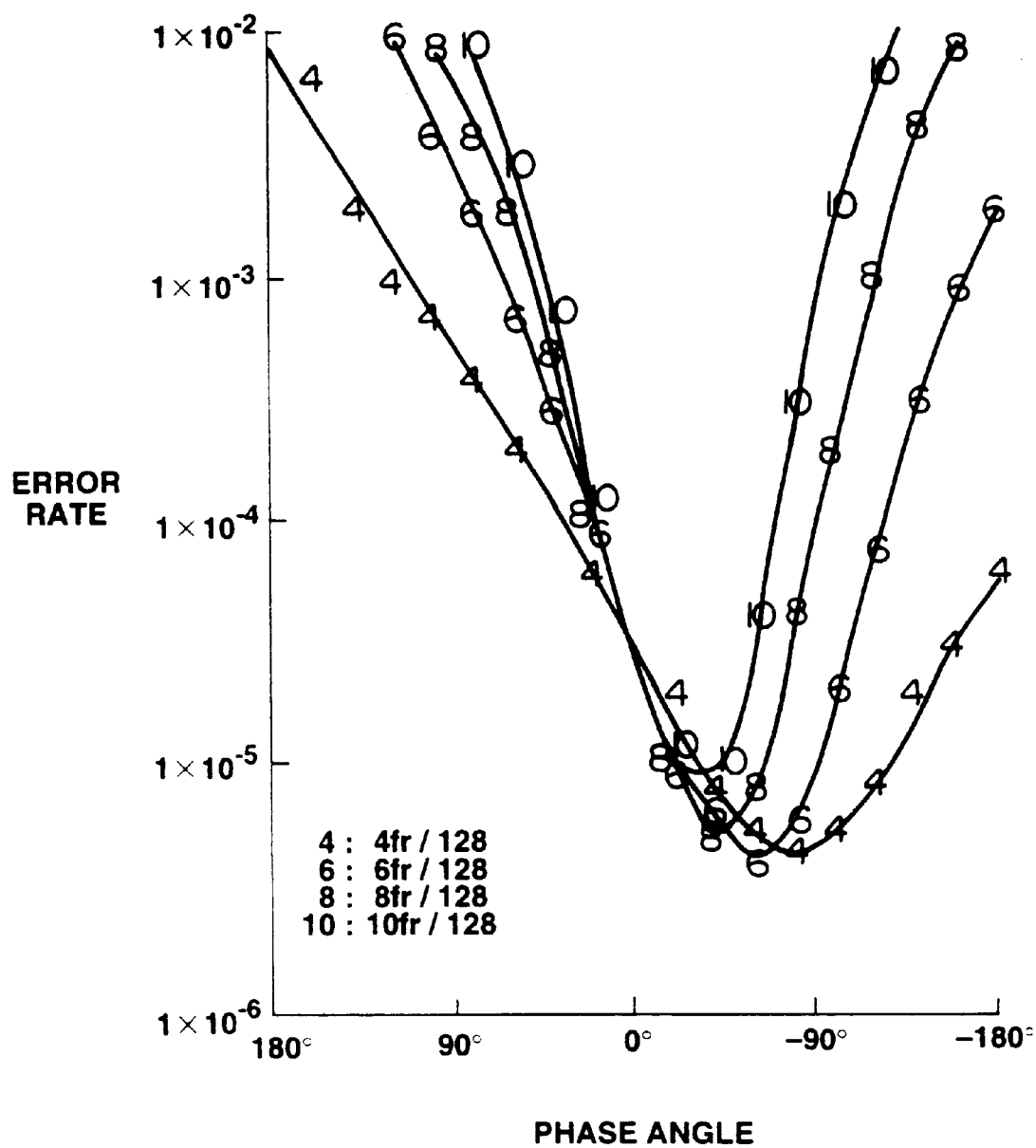
FIG. 10 is a graph showing phase characteristics of primary LPF and HPF.

Also, when the cut-off frequency of the amplitude is set to $f_r/128$ Hz, the frequency having the phase of 0 degree is defined as the cut-off frequency of the phase. Then, employing cut-off frequencies of the phase, such as, $4f_r/128$ Hz, $6f_r/128$ Hz, $8f_r/128$ Hz and $10f_r/128$ Hz, as parameters, the error rate is measured with the phase having the frequency of 0 Hz, varied to 180, 90, 0, −90 and −180 degrees as shown in FIG. 5. In this data recording/reproducing device, the error rate may be improved in a range of cut-off frequencies of the phase from $4f_r/128$ Hz to $12f_r/128$ Hz and the phase having the frequency at 0 Hz of −80 to −30 degrees, in comparison with the case where the FIR filter 26 does not correct the phase (0), that is, when the phase angle is 0 degree, as shown in FIG. 10.

Stated differently, the error rate may be improved substantially by two digits by employing the FIR filter 26 having the frequency characteristic as shown in FIG. 5.

Meanwhile, the FIR filter may be constituted by only the coefficients of the 54th to 92th stages of the 128-order FIR filter 26, ignoring the other stages. In general, by forming the FIR filter employing only the coefficients corresponding to samples at the periphery of the maximum value ($K_{65}$= 0.968413) and up to the zero-crossing sample, the number of stages of the FIR filter may be reduced. That is, with all the coefficients corresponding to samples outside of the zero-crossing sample ignored, the order of the FIR filter is set to 39 as shown in the following Table 2, so that the number of stages of the FIR filter may be set to 39.

TABLE 2

| STAGE (i) | COEFFICIENT ($K_i$) |
|---|---|
| 1 | −0.001107 |
| 2 | −0.002592 |
| 3 | −0.004444 |
| 4 | −0.006645 |
| 5 | −0.009167 |
| 6 | −0.011971 |
| 7 | −0.015009 |
| 8 | −0.018227 |
| 9 | −0.021562 |
| 10 | −0.024947 |
| 11 | −0.028313 |
| 12 | 0.968413 |
| 13 | −0.034699 |
| 14 | −0.037581 |
| 15 | −0.040169 |
| 16 | −0.042405 |
| 17 | −0.044239 |
| 18 | −0.045632 |
| 19 | −0.046552 |
| 20 | −0.046980 |
| 21 | −0.046908 |
| 22 | −0.046340 |
| 23 | −0.045290 |
| 24 | −0.043785 |
| 25 | −0.041861 |
| 26 | −0.039560 |
| 27 | −0.036935 |
| 28 | −0.034043 |
| 29 | −0.030946 |
| 30 | −0.027707 |
| 31 | −0.024389 |
| 32 | −0.021056 |
| 33 | −0.017766 |
| 33 | −0.014576 |
| 35 | −0.011532 |
| 36 | −0.008678 |
| 37 | −0.006047 |
| 38 | −0.003665 |
| 39 | −0.001549 |

Figure 11:
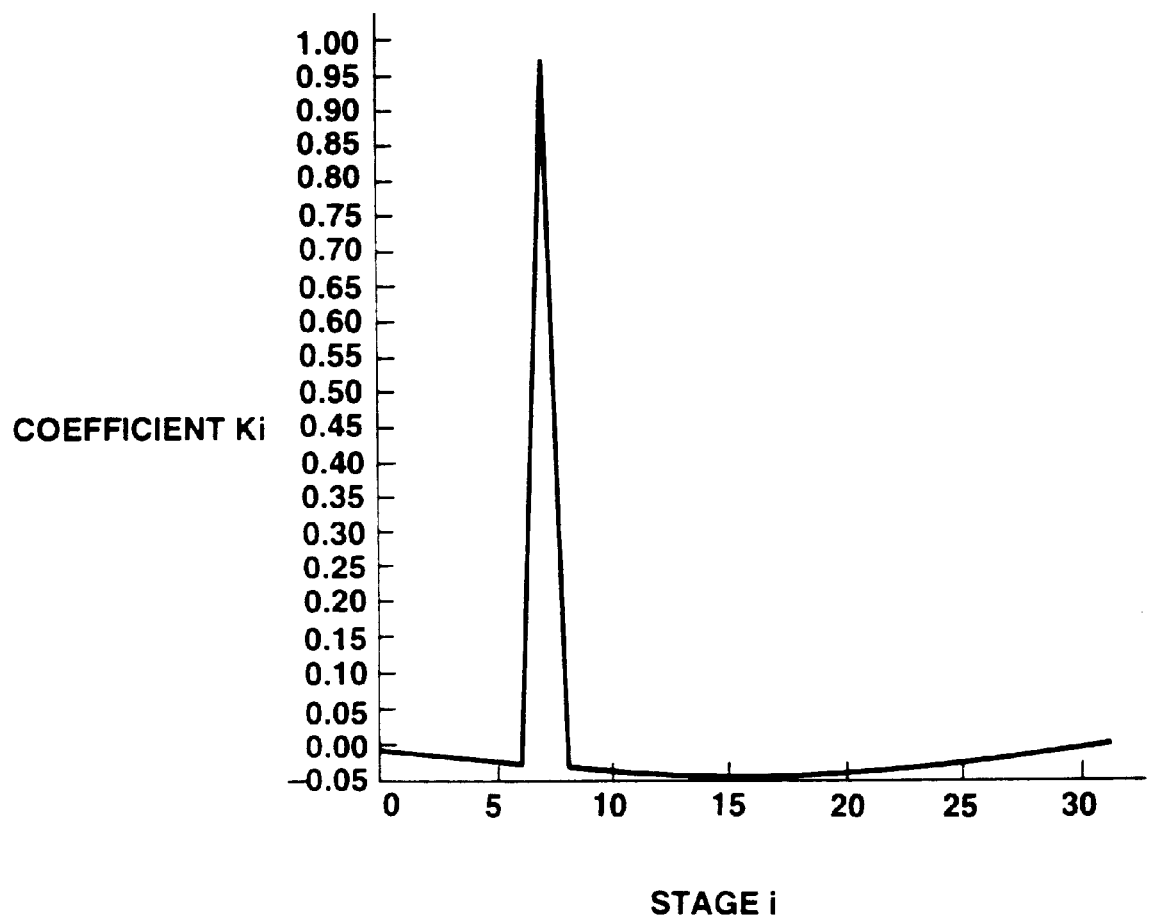
FIG. 11 is a graph showing phase characteristics of a reproducing system of a conventional device like DAT.

The FIR filter may also be constituted by ignoring the coefficients corresponding to samples outside of the first sample that is not greater than 1/100 in absolute value among from the samples in the vicinity of the maximum value of coefficient. In this case, as shown in the following Table 3 and FIG. 11, the FIR filter is constituted by the 58th to 89th stages of coefficients of the FIR filter 26, with the order of 32.

TABLE 3

| STAGE (i) | COEFFICIENT ($K_i$) |
|---|---|
| 1 | −0.009167 |
| 2 | −0.011971 |
| 3 | −0.015009 |
| 4 | −0.018227 |
| 5 | −0.021562 |
| 6 | −0.024947 |
| 7 | −0.028313 |
| 8 | 0.968413 |
| 9 | −0.034699 |
| 10 | −0.037581 |
| 11 | −0.040169 |
| 12 | −0.042405 |
| 13 | −0.044239 |
| 14 | −0.045632 |
| 15 | −0.046552 |
| 16 | −0.046980 |
| 17 | −0.046908 |
| 18 | −0.046340 |
| 19 | −0.045290 |
| 20 | −0.043785 |
| 21 | −0.041861 |
| 22 | −0.039560 |
| 23 | −0.036935 |
| 24 | −0.034043 |
| 25 | −0.030946 |
| 26 | −0.027707 |
| 27 | −0.024389 |
| 28 | −0.021056 |
| 29 | −0.017766 |
| 30 | −0.014576 |
| 31 | −0.011532 |
| 32 | −0.008678 |

With these FIR filters, the circuit size can be reduced without deteriorating the error rate in the foregoing embodiment.

It is to be understood that the present invention is not limited to the foregoing embodiment, and that the present invention can apply to a magnetic disk device employing a magnetic disk as a recording medium.

As is clear from the above description, in the present invention, the reproducing signal is detected from the magnetic recording medium in which data is recorded and the equalizer equalizes the reproducing signal. The sampling circuit samples the reproducing signal from the equalizer, and the filter having the characteristic of linearly delaying the phase of the reproducing signal in a range having frequencies not higher than the predetermined frequency performs filtering of the resulting sampled value. Thus, the phase compensation in the low frequency range of the reproducing signal can be performed satisfactorily in comparison with the conventional device.

What is claimed is:

1. A data reproducing device for reproducing data recorded on a magnetic recording medium, the device comprising:

a magnetic head for detecting a reproducing signal from the magnetic recording medium;

an equalizer for equalizing a waveform of the reproducing signal detected by the magnetic head;

a sampling circuit for sampling the reproducing signal equalized by the equalizer in accordance with a clock signal synchronous with the reproducing signal and outputting a sampled value; and a high pass FIR filter for filtering the sampled value from the sampling circuit in accordance with the clock signal and compensating a phase of the reproducing signal in the sampled value, wherein a phase characteristic of the FIR filter is a linear, non-zero. Phase lag in a range having frequencies from 0 Hz to $(i/N)f_r$ Hz and is 0 in a range having frequencies not lower than $(i/N)f_r$ Hz, with $f_r$ denoting a sampling frequency, N denoting an order of the filter, and i denoting a predetermined positive integer, and an amplitude characteristic of the FIR filter is 0 in a range having frequencies from 0 Hz to $(j/N)f_r$ Hz, is linear in a range having frequencies from $(j/N)f_r$ Hz to $(k/N)f_r$ Hz, and is 1 in a range having frequencies not lower than $(k/N)f_r$ Hz, with i, j and k being positive integers having a relation of $j<k<i$.

2. The data reproducing device as claimed in claim 1, further comprising a Viterbi decoder for carrying out Viterbi decoding of the filtered sampled value with the phase of the reproducing signal in the sampled value compensated by the FIR filter.

3. The data reproducing device as claimed in claim 2, wherein the data recorded on the magnetic recording medium is data that is pre-coded in response to a partial response (1, 1).

4. The data reproducing device as claimed in claim 3, wherein the data recorded in the magnetic recording medium is data that is transformed into a code signal free of DC.

5. The data reproducing device as claimed in claim 1, wherein a coefficient of the FIR filter is obtained by performing inverse Fourier transform on the phase characteristic and the amplitude characteristic, each of which are approximated.

6. The data reproducing device as claimed in claim 5, wherein the FIR filter utilizes only coefficients corresponding to samples at a periphery of a sample having a maximum value, and only coefficients up to a sample having a zero-crossing coefficient value from among N samples of the FIR filter.

* * * * *